US006482477B1

United States Patent
Westhoff et al.

(10) Patent No.: US 6,482,477 B1
(45) Date of Patent: Nov. 19, 2002

(54) METHOD FOR PRETREATING DIELECTRIC LAYERS TO ENHANCE THE ADHESION OF CVD METAL LAYERS THERETO

(75) Inventors: Richard C. Westhoff, Hudson, NH (US); Steven P. Caliendo, Gold Canyon, AZ (US); Joseph T. Hillman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 09/723,876

(22) Filed: Nov. 28, 2000

(51) Int. Cl.$^7$ .............................................. C23C 16/34
(52) U.S. Cl. ...................... 427/535; 427/536; 427/537; 427/576; 427/253; 427/255.39; 438/680; 438/685
(58) Field of Search ................................. 427/535, 536, 427/537, 576, 253, 255.39; 438/680, 685

(56) References Cited

U.S. PATENT DOCUMENTS 5,919,531 A * 7/1999 Arkles et al. ............... 427/253
6,139,922 A * 10/2000 Kaloyeros et al. .......... 427/253
6,201,276 B1 * 3/2001 Agarwal et al. ............. 257/315

FOREIGN PATENT DOCUMENTS

JP    11074458    * 3/1999

* cited by examiner

Primary Examiner—Timothy Meeks
(74) Attorney, Agent, or Firm—Wood, Herron & Evans, LLP

(57) ABSTRACT

A method for chemical vapor deposition comprises providing a quantity of nitrogen at the interface between a transition metal-based material and an underlying dielectric-covered substrate. The nitrogen can be provided by heating the substrate in an atmosphere of a nitrogen-containing process gas or by exposing the surface of the dielectric-covered substrate to a plasma generated from a nitrogen-containing process gas. In certain embodiments, the nitrogen on the surface of the dielectric is bound with atoms of a transition metal to form a thin layer of a transition metal nitride. The method promotes the adhesion of the transition metal-based layer to the dielectric by nullifying the effect of halogen atoms that are also incorporated at the transition metal/dielectric interface.

17 Claims, 3 Drawing Sheets

METHOD FOR PRETREATING DIELECTRIC LAYERS TO ENHANCE THE ADHESION OF CVD METAL LAYERS THERETO

FIELD OF THE INVENTION

The present invention relates to chemical vapor deposition, integrated circuit fabrication and, in particular, to methods for depositing transition metal-based layers on a dielectric substrate.

BACKGROUND OF THE INVENTION

The semiconductor industry is committed to introducing copper interconnects as a replacement for conventional aluminum and aluminum alloy interconnects in future generations of semiconductor devices. With its greater current carrying capacity, the introduction of copper interconnects should reduce device geometry, power consumption and heat generation. However, copper is a fast diffuser in silicon and drifts in dielectrics, resulting in a deterioration of devices at low temperatures. To avoid unwanted migration of copper atoms, a barrier layer of a transition metal-based material, such as a tantalum-based material and more particularly tantalum or tantalum nitride, is typically used as a diffusion barrier between a copper interconnect layer and an underlying dielectric layer, such as a layer of silicon oxide. One method of providing the diffusion barrier is physical vapor deposition (PVD) by sputtering. However, sputter deposition, among other problems, cannot adequately cover the sidewalls of near-surface features having a high aspect ratio because sputtering is essentially a line-of-sight deposition process.

Two chemical vapor deposition (CVD) processes, thermal CVD and plasma-enhanced CVD (PECVD), are candidates to replace PVD and provide highly uniform layers that conform to topographical features having high aspect ratios. Thermal CVD is a high temperature process in which a flow of gaseous reactants over a heated semiconductor substrate chemically react to deposit a solid layer on the heated substrate. Plasma-enhanced CVD is a relatively low-temperature process which introduces a plasma to activate the gaseous reactants.

To deposit a transition metal-based barrier layer, both CVD processes react a vapor-phase reactant, for example a transition metal halide reagent, such as a tantalum halide or more particularly tantalum pentafluoride ($TaF_5$), with a reducing gas, for example a hydrogen-containing gas, such as either hydrogen ($H_2$) or ammonia ($NH_3$). If, for example, the reducing gas is hydrogen and the vapor-phase reactant is a tantalum halide, tantalum (Ta) is deposited, while tantalum nitride ($TaN_x$) is deposited if the reducing gas is a nitrogen-containing gas, such as ammonia or a mixture of nitrogen and hydrogen. The chemical reduction of the transition metal halide vapor-phase reactant produces halogen atoms as a by-product.

The layer of transition metal-based material deposited by either of the CVD methods using a gas mixture comprising a transition metal halide vapor-phase reactant will incorporate a low residual level of the by-product halogen atoms as an unwanted impurity. For example, a layer of tantalum deposited on a substrate by plasma-enhanced CVD using, for example, tantalum pentafluoride will usually contain about 0.5 atomic percent of the residual halide, in this instance the residual halide being fluorine. If the tantalum layer is deposited on a dielectric-covered substrate, such as a silicon oxide layer on a silicon base, by plasma-enhanced CVD using tantalum pentafluoride, residual fluorine is trapped with an enhanced concentration near the tantalum/dielectric interface. Under certain circumstances, the peak concentration of residual fluorine can approach 5 atomic percent near the tantalum/oxide interface. Halide atoms are expected to be present at similar levels near the metal/dielectric interface between transition metal-based layers deposited by CVD using a transition metal halide and an underlying dielectric.

The elevated concentration of halogen atoms present at the metal/dielectric interface has been found to correlate with a significantly reduced adhesion of the transition metal-based layer to the underlying dielectric. Halogen atoms significantly disrupt the atomic bonding at the interface between the transition metal-based layer and the dielectric so that the transition metal-based layer, and any overlying layers, are more likely to delaminate from the surface of the dielectric.

There is thus a need for a CVD method that will prevent interfacial halogen atoms from altering the adhesion of a transition metal-based layer deposited by a CVD process on a dielectric-covered substrate.

SUMMARY OF THE INVENTION

The present invention provides a method of depositing a transition metal-based layer onto a dielectric-covered semiconductor substrate, wherein the layer of transition metal-based material has a significantly enhanced adhesion to the dielectric. To this end and in accordance with the principles of the present invention, the substrate is heated to a predetermined temperature and the dielectric surface of the substrate is exposed to a gas atmosphere comprising a nitrogen-containing process gas for a predetermined time. The nitrogen may be incorporated by exposing a heated substrate to a plasma generated from the nitrogen-containing process gas or by a non-plasma heat treatment in the gas atmosphere of the nitrogen-containing process gas. As a result of the pretreatment, the dielectric incorporates a quantity of nitrogen at its surface. The pretreatment may further include hydrogen in the gas atmosphere to incorporate a quantity of hydrogen into the dielectric surface. Following the thermal or plasma pretreatment, a layer of a transition metal-based material is deposited by a CVD process, such as plasma-enhanced CVD or thermal CVD, onto the surface of the dielectric via a chemical reaction between a transition metal halide vapor-phase reactant and a reducing gas.

After the deposition, the nitrogen from the pretreatment remains positioned near the metal/dielectric interface. The presence of the nitrogen reduces the effect of by-product halogen atoms from the CVD chemical reaction upon the adhesion of the transition metal-based material to the surface of the dielectric. Where hydrogen is also positioned near the metal/dielectric interface, it too reduces the effect of the by-product halogen atoms. In certain embodiments, the layer of transition metal-based metal may comprise either tantalum or tantalum nitride formed by either thermal CVD or plasma-enhanced CVD utilizing a tantalum halide vapor-phase reactant, such as tantalum pentafluoride.

In one embodiment, the nitrogen is incorporated onto the surface of the dielectric-covered semiconductor substrate in the form of a thin layer of a transition metal nitride. The thickness of the thin layer of transition metal nitride may range from about 0.5 nm to about 2.5 nm. The transition metal can originate from residual transition metal halide adsorbed on internal surfaces of the CVD reactor or can be intentionally introduced into the CVD reactor along with or before the nitrogen-containing process gas.

The present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

According to the present invention, a dielectric-covered semiconductor substrate is exposed to a nitrogen-containing atmosphere prior to the chemical vapor deposition (CVD), for example thermal CVD or plasma-enhanced CVD, of a layer of a transition metal-based material using a transition metal halide vapor-phase reactant. Incorporation of nitrogen in the vicinity of the interface between the transition metal-based material and the dielectric significantly improves the adhesion of the transition metal-based layer to the surface of the dielectric.

In one embodiment of the present invention, a dielectric-covered semiconductor substrate is pretreated with a plasma generated from a nitrogen-containing process gas in a reactor configured for plasma-enhanced CVD of the transition metal-based material. In an alternative embodiment, the dielectric-covered semiconductor substrate is thermally pretreated with a non-plasma-assisted exposure to a gas atmosphere containing a nitrogen-containing gas in a reactor configured for plasma-enhanced CVD of the transition metal-based material. Following the pretreatment, the transition metal-based material is deposited by plasma-enhanced CVD using a transition metal halide vapor-phase reactant. However, it will be understood by those of ordinary skill in the art that the present invention may be used to pre-treat the dielectric-covered semiconductor substrate prior to depositing the layer of transition metal-based material in a reactor configured for thermal CVD using a transition metal halide vapor-phase reactant, without departing from the spirit and scope of the present invention. As used herein, the substrate can be completely or partially covered by a dielectric material, which may have a patterned or continuous surface.

Exemplary dielectric materials familiar to those of ordinary skill in the art of integrated circuit fabrication include oxides such as tantalum oxide, silicon oxides, fluorinated silicon oxides, porous silicon oxides, and carbon-doped silicon oxides; polymers, such as xerogels, aerogels, methyl silsesquioxane (MSQ), and hydrogen silsesquioxane (HSQ); fluorinated amorphous carbon (CFx); barium strontium titanate (BST); and lead zirconium titanate (PZT). As is known, aerogels and xerogels are classes of porous polymers which have a low dielectric constant and CFx is an amorphous carbon containing approximately 4 atomic percent fluorine.

Figure 1:
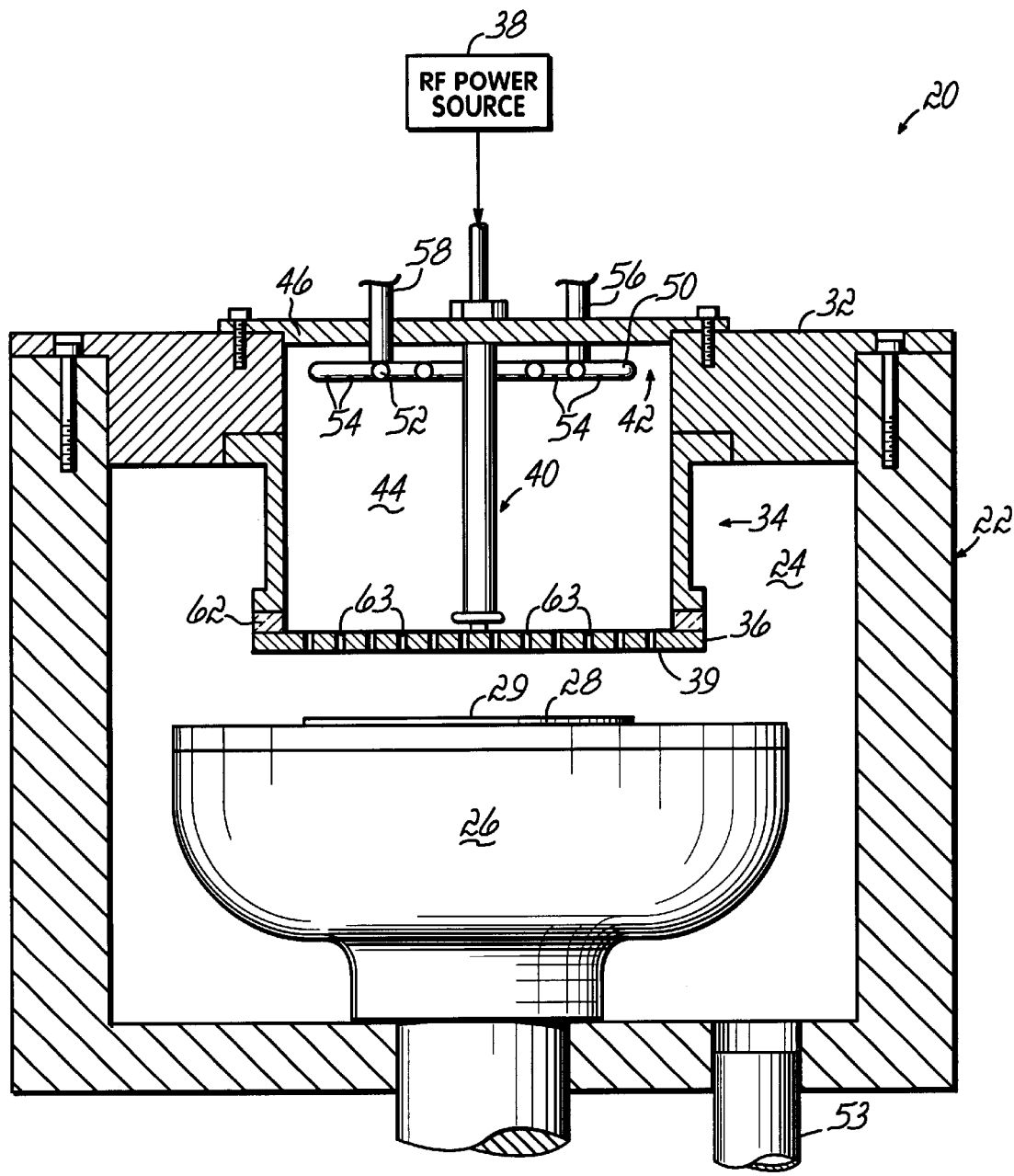
FIG. 1 is a side view, partially in cross-section, of a reactor used to practice the method of the present invention.

A schematic of an exemplary reactor 20 of the present invention, suitable for plasma-enhanced CVD of a layer of material on a semiconductor substrate 28, is shown in FIG. 1. The particular embodiment of the apparatus 20 shown herein is provided only to illustrate operation of the invention and should not be used to limit the scope of the invention. For example, the apparatus 20 can be used for non-plasma processes such as thermal CVD, and can be used for manufacturing processes other than semiconductor fabrication.

Reactor 20 includes a chamber housing 22 which bounds a reaction space 24 and a susceptor 26 positioned within the reaction space 24 for holding and supporting a wafer or substrate 28. A heating element (not shown) is provided for selectively heating susceptor 26 and substrate 28 to a temperature between about 200° C. and about 800° C. Substrate 28 may be any semiconductor substrate typically employed in the fabrication of integrated circuits, including silicon or gallium arsenide, as well as such substrates having patterned areas of metallization, contacts, insulating layers and the like.

A gas-dispersing showerhead 36 is supported by a cylindrical assembly 34 directed in a downward direction from a top wall 32 of chamber housing 22. A bottom surface 39 of showerhead 36 is suspended above the top surface 29 of substrate 28 in a spaced, confronting relationship. A flow passage 44 extends vertically between showerhead 36 and a housing cover 46 over an opening 42 provided in top wall 32. Flow passage 44 receives a vapor-phase reactant and a reducing gas from a spaced array of holes 54 in concentric gas rings 50, 52. Supply lines 56, 58 provide the mixture of process gases to gas rings 50, 52, wherein the flow is regulated by a flow metering device (not shown). The array of holes 54 in each ring 50, 52 is configured to evenly disperse the gases within the flow passage 44 and uniformly combine the reducing gas and the vapor-phase reactant. The mixture of process gases in flow passage 44 is exhausted through an array of holes 63 positioned and configured to provide a uniform flow of the process gas mixture over the top surface 29 of substrate 28.

A radio frequency (RF) generator 38 is operably connected to showerhead 36 by an appropriate RF feedline assembly 40 which extends through cover 46. The RF generator 38 selectively applies a bias power to the showerhead 36, which functions as a powered electrode. Showerhead 36 is electrically isolated from the remainder of reactor 20 by an insulator ring 62. Susceptor 26 provides a complementary parallel electrode at a ground potential in an opposed and spaced relationship to showerhead 36 so that a substantially uniform RF field exists within the portion of reaction space 24 therebetween. The RF generator 38 operates at a frequency of between about 40 kHz and about 16 MHz, typically at about 13.56 MHz, and supplies an RF power to showerhead 36 of between about 100 Watts and about 1000 Watts, with a typical power level of about 250 Watts.

The RF field imposed between showerhead 36 and susceptor 26 capacitively couples with gas atoms in the process gas mixture to initiate a plasma in the portion of reaction space 24 between showerhead 36 and substrate 28, which activates the vapor-phase reactant. The activated vapor-phase reactant and the reducing gas combine in a chemical reaction to incrementally deposit a thickness of a solid layer of material on surface 29. The composition of the layer depends upon the identity of the gases and other process parameters. Spent process gases and reaction byproducts from the reaction space 24 are evacuated by a vacuum pump (not shown) through evacuation port 53 while the mixture of fresh process gases is simultaneously introduced through holes 63. Thus, a flow of the process gas mixture is established between showerhead 36 and evacuation port 53. It will be appreciated by those of ordinary skill in the art that the plasma in reaction space 24 may be generated by an alternative method, such as inductive coupling of RF energy between an RF-powered coil and the process gas mixture.

To deposit a layer of a transition metal-based material on substrate 28 by plasma-enhanced CVD, a mixture of process gases including vapor-phase reactant, such as a transition metal halide or more particularly tantalum pentafluoride ($TaF_5$), a hydrogen-containing reducing gas, such as either hydrogen ($H_2$) or ammonia ($NH_3$), and an inert gas of a high-molecular weight, such as argon (Ar) or xenon (Xe), is provided through the showerhead 36 to reaction space 24. The flow rate of the vapor-phase reactant is about 2 to about 100 standard cubic centimeters per minute (sccm), for example about 20 sccm, with a significant molar excess of the hydrogen-containing gas in the range of about 500 sccm to about 5000 sccm, for example about 2000 sccm. Generally, the flow rate of the hydrogen-containing reducing gas will be a factor of about 5 to about 100 greater than the flow rate of the vapor-phase reactant. The inert gas is introduced with a flow rate of about 50 sccm to about 1000 sccm, for example about 300 sccm. The inlet temperature for the gas mixture is not critical, but may be for example approximately 150° C. The operating vacuum pressure of reaction space 24 is maintained in the range of about 200 mTorr to about 10 Torr, for example about 2 Torr. If the reducing gas comprises hydrogen and lacks nitrogen, a pure transition metal layer is deposited on substrate 28. If the reducing gas further comprises nitrogen, a layer of transition metal nitride will be deposited on substrate 28. For certain applications, the transition metal layer and the transition metal nitride are deposited sequentially to form a stack of composition-modulated layers. It will be understood by those of ordinary skill in the art that the present invention may be used to pretreat the dielectric-covered substrate prior to depositing alternative transition metal-based materials by CVD, such as a titanium-based material or a tungsten-based material, without departing from the spirit and scope of the present invention.

Supply lines 56, 58 provide process gases to passage 44. The process gases mix in passage 44 and the process gas mixture is discharged through the array of holes 63 in showerhead 36, which is energized by the RF generator 38. An amount of RF power sufficient to generate a plasma between the showerhead 36 and substrate 28 is applied, which is in the range of about 100 Watts to about 1000 Watts, for example about 250 Watts, at a frequency of preferably about 13.56 MHz. While in the presence of the plasma, substrate 28 is heated to a temperature between about 200° C. and about 500° C., for example to a temperature of about 350° C. The activated radicals of vapor-phase reactant flow over the heated substrate 28 and react with the reducing gas to deposit a layer of material on surface 29. The deposition rate of the transition metal-based material depends upon process parameters, such as pressure, gas flow rates, temperature, and RF power.

A layer of transition metal material deposited by CVD using a transition metal halide as a vapor-phase reactant, as for example in a plasma-enhanced CVD system such as reactor 20, will also incorporate a concentration of by-product halogen atoms as an impurity. For a typical CVD process using tantalum pentafluoride as the vapor-phase reactant, the residual level of fluorine in a tantalum layer will be approximately 0.5 atomic percent. Of greater significance is a concentration of fluorine as high as 5 atomic percent which is trapped at the interface between the dielectric and the tantalum layer. In addition, tantalum layers grown by plasma enhanced CVD contain about 0.1 atomic percent of nitrogen and a slightly higher concentration of about 0.4 atomic percent near the tantalum/dielectric interface.

Tantalum nitrides deposited by thermal CVD or plasma-enhanced CVD exhibit better adhesion to a dielectric than a layer of the tantalum, even though the layer of tantalum nitride generally incorporates a higher fluorine content. By way of example, nitrogen is incorporated in tantalum nitride by the following reaction for thermal CVD:

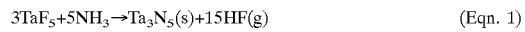

$$3TaF_5 + 5NH_3 \rightarrow Ta_3N_5(s) + 15HF(g) \qquad \text{(Eqn. 1)}$$

In a further example, nitrogen is incorporated in tantalum nitride by the following reaction for plasma-enhanced CVD:

$$2TaF_5 + XN_2 + 5H_2 \rightarrow 2TaN_x(s) + 10HF(g) \qquad \text{(Eqn. 2)}$$

The variable X in Eqn. 2 can be modified between about 0.5 and about 1.7 by altering the nitrogen flow, the RF power, or by using ammonia as a nitrogen-containing reducing gas rather than a mixture of nitrogen and hydrogen.

According to one embodiment of the present invention, the adhesion of a transition metal-based layer, such as a transition metal layer or a modulated transition metal/transition metal nitride layer, to a dielectric-covered substrate can be improved if a sufficient level of nitrogen is incorporated at the interface between the transition metal-based layer and the dielectric. In particular, the adhesion can be improved by pretreating the surface of the dielectric-covered semiconductor substrate with a nitrogen-containing atmosphere before depositing the layer of transition metal-based material.

In one embodiment according to the principles of the present invention, the nitrogen pretreatment is a thermal pretreatment and comprises heating the dielectric-covered substrate 28 to a predetermined temperature and exposing the heated substrate 28 to a nitrogen-containing process gas for a predetermined time. The thermal nitrogen pretreatment should be performed after the substrate 28 is loaded into a CVD reactor, such as reactor 20. The thermal nitrogenous gas pretreatment has been found to significantly improve the adhesion of the transition metal-based layer to the dielectric-covered substrate. The thermal nitrogen-containing gas pretreatment is performed at a substrate temperature between about 150° C. and about 500° C., for example about 350° C., and is usually performed at about the same temperature as the subsequent CVD process that deposits the layer of transition metal-based material. Other parameters for the thermal nitrogenous gas pretreatment are a flow rate of a nitrogen-containing process gas between about 200 sccm to about 8000 sccm, for example about 2000 sccm; a reducing gas flow rate ranging from about 0 sccm to about 8000 sccm, for example about 2000 sccm; an inert gas flow rate from about 0 sccm to about 1000 sccm, for example about 300 sccm; and a reactor pressure ranging from about 100 mTorr to about 10 Torr, for example about 2 Torr. The predetermined time effective for enhancing the adhesion of the transition metal-based material to the pretreated surface of the dielectric ranges from about 5 seconds to about 90 seconds, for example about 30 seconds of exposure. The nitrogen-containing process gas can be, for example, ammonia, hydrazine, or nitrogen, but typically will comprise ammonia. The flow of the reducing gas, usually hydrogen, can be reduced to 0 sccm, particularly where the nitrogen-containing process gas also contains hydrogen. Furthermore, the flow of the inert gas, such as argon or xenon, is optional. Where hydrogen is present, either as part of the nitrogenous process gas or as a separate reducing gas, a quantity of hydrogen is incorporated along with a quantity of nitrogen at the dielectric surface. This absorbed hydrogen is then available to react with halogen atoms generated during subsequent CVD of the transition metal, thereby reducing the presence of by-product halogen atoms.

In another embodiment according to the principles of the present invention, the nitrogen pretreatment consists of exposing the dielectric-covered semiconductor substrate to a plasma excited from a nitrogen-containing process gas as provided within reactor 20. The parameters for the nitrogen plasma pretreatment are a substrate temperature ranging between about 150° C. to about 500° C., for example about 350° C.; a nitrogen-containing process gas flow rate of between about 200 sccm to about 8000 sccm, for example about 2000 sccm; a reducing gas flow rate ranging from about 0 sccm to about 8000 sccm, for example about 2000 sccm; an inert gas flow rate from about 0 sccm to about 1000 sccm, for example about 300 sccm; a reactor pressure ranging from about 100 mTorr to about 10 Torr, for example about 2 Torr; and an RF power ranging from about 100 Watts to about 1000 Watts, for example about 250 Watts. The process time of pretreatment effective for enhancing the adhesion of the transition metal-based material to the pretreated surface of the dielectric ranges from about 30 seconds to about 10 minutes, for example about 60 seconds of plasma exposure. The nitrogen-containing process gas can be, for example, ammonia, nitrogen, hydrazine, or any other nitrogen-containing gas. The reducing gas can be hydrogen, for example. However, the flow of reducing gas can be eliminated, particularly where the nitrogen-containing process gas also comprises hydrogen, such as occurs if the nitrogen-containing process gas is ammonia. Furthermore, the flow of inert gas, such as argon or xenon, is optional for the function of aiding in plasma initiation and maintenance and can be eliminated if that function is not needed. Again, as stated in the previous paragraph, the inclusion of hydrogen in the pretreatment gas atmosphere can further reduce the effects of by-product halogen atoms.

In one possible mechanism, the nitrogen is incorporated as a thin layer of transition metal nitride formed on the surface of the dielectric-covered semiconductor substrate. The transition metal required to grow the thin transition metal nitride layer is derived from residual amounts of transition metal halide present on internal surfaces of the reactor 20, such as chamber housing 22, remaining following historical depositions of transition metal-based material within reactor 20. To be an effective adhesion promoter without altering the properties of the barrier layer or interconnect layer, the thin transition metal nitride layer should have a thickness of about 0.5 nm to about 2.5 nm. Thicknesses in this range represent average values because the thin layer of transition metal nitride is believed to constitute a highly dense distribution of spaced islands of nuclei for subsequent layer growth.

The adhesion enhancement of a transition metal-based layer to an underlying dielectric resulting from a nitrogenous plasma pretreatment is more significant than the resulting improvement following a thermal nitrogenous pretreatment. The adhesion of a layer on a surface can be quantified by a quantitative pull test in which a small metal pin is epoxied to the layer surface. Pull tests performed for tantalum layers deposited by CVD on silicon oxide, following a nitrogenous plasma pretreatment, indicate that a pulling force between about 70 MPa to about 90 MPa is needed to lift the pin from the substrate. However, pulling forces of this magnitude are characteristic of the adherence of the epoxied stud to the layer and denote the pulling force required to detach the epoxy from the layer, rather than delamination of the layer from the oxide surface. Thus, the pulling force actually required to lift the layer from the dielectric exceeds the range of about 70 MPa to about 90 MPa. For the thermal nitrogenous pretreatment, the tantalum layer lifted or delaminated from the surface of the oxide, attached to the pin, at a pulling force in the range of about 20 MPa to about 70 MPa. If a pretreatment with a nitrogen-based atmosphere is not performed, the tantalum layer delaminates from the surface of the oxide soon after removal from the CVD reactor, as the substrate cools, due to internal stresses within the tantalum layer.

In an alternative embodiment according to the principles of the present invention, the plasma pretreatment can be performed using a plasma of a nitrogen-containing and hydrogen-containing gas after exposing the dielectric-covered semiconductor substrate, heated to a predetermined temperature, to a vapor-phase reactant comprising a transition metal halide, such as a tantalum pentafluoride. The parameters for exposure are a substrate temperature ranging between about 150° C. to about 500° C., for example about 350° C.; a flow rate of vapor-phase reactant is about 2 to about 100 sccm; and a reactor pressure ranging from about 100 mTorr to about 10 Torr, for example about 2 Torr. The usual exposure time is about 30 seconds to about 2 minutes. The exposure of the substrate to the transition metal halide vapor is believed to leave a residual coating of transition metal halide, perhaps on the order of a monolayer thick, adsorbed on the exposed dielectric surfaces. The dielectric surfaces having the adsorbed coating of transition metal halide are then exposed for a predetermined time to a plasma generated from a nitrogen-containing and hydrogen-containing process gas, such as ammonia, under conditions similar to those set out above. A thin layer of transition metal nitride is believed to grow on the surface of the dielectric.

In an alternative embodiment according to the principles of the present invention, a thin layer of transition metal nitride could be grown on the dielectric-covered semiconductor substrate by conventional plasma-enhanced CVD or thermal CVD using a process gas mixture of a transition metal halide vapor-phase reactant and a nitrogen-containing and hydrogen-containing process gas, prior to depositing a transition metal-based barrier layer. However, the deposition parameters must be precisely controlled for depositing a very thin layer of transition metal nitride and can be performed with or without plasma assistance in a reactor similar to reactor 20 under conditions similar to those set out above for plasma-enhanced CVD in reactor 20.

While plasma-enhanced CVD has been specifically discussed, it will be appreciated that the layer of transition metal-based material may be deposited by an alternative chemical vapor deposition process, such as thermal CVD, without departing from the spirit or scope of the present invention. To prepare a transition metal-based layer by thermal CVD, a transition metal halide vapor-phase reactant, such as a tantalum pentahalide, and a reducing gas, such as hydrogen or ammonia, are introduced into the reactor and passed with a controlled flow rate over the surface of a semiconductor substrate heated to a temperature between about 300° C. and about 1300° C.

Preferably, the pretreatment and the deposition of the transition metal-based layer are performed in a brief period and within the same reactor. The in-situ process prevents contamination of the nitrogen-activated surface of the dielectric during transfer between processing chambers. Furthermore, the degree of adhesion enhancement of the transition metal-based layer to the dielectric has been found to decrease with increasing time between the nitrogenous pretreatment and the CVD of the transition metal-based layer. Thus, even if the pretreatment and CVD transpire in the same reactor, the CVD should occur shortly after the pretreatment to optimize the enhanced adhesion.

Following the pretreatment with the nitrogen-based gas, a transition metal-based barrier layer is deposited by a CVD process usually in the same reactor in which the plasma or thermal pretreatment was performed. The thickness of the deposited barrier layer is sufficient to prevent diffusion of copper from the copper interconnect, which is deposited on top of the transition metal-based layer, into the oxide during subsequent high temperature processing. The usual thickness of the diffusion barrier, effective for preventing copper diffusion without altering the character of the interconnect, is between about 10 nm and about 40 nm.

COMPARATIVE EXAMPLE

A CVD reactor similar to reactor 20 was heated in a gaseous atmosphere of ammonia ($NH_3$) to a temperature of about 350° C. The ammonia flowed into the reactor at a rate of 2000 sccm such that the reactor pressure was maintained at about 2 Torr. After a predetermined exposure time of about 1 minute, the reactor was evacuated. A silicon oxide-covered surface of a silicon substrate was then loaded into the CVD reactor. A tantalum layer having a nominal thickness of 20 nm was then deposited by plasma-enhanced CVD using tantalum pentahalide as a vapor-phase reactant and hydrogen as a reducing gas. Deposition conditions for the tantalum layer included a substrate temperature of about 350° C.; a tantalum fluoride flow rate of about 20 sccm; a hydrogen flow rate of about 2000 sccm; an argon flow rate of about 300 sccm; a reactor vacuum pressure of about 2 Torr; and an RF power of about 250 Watts at a frequency of about 13.6 MHz.

Figure 2:
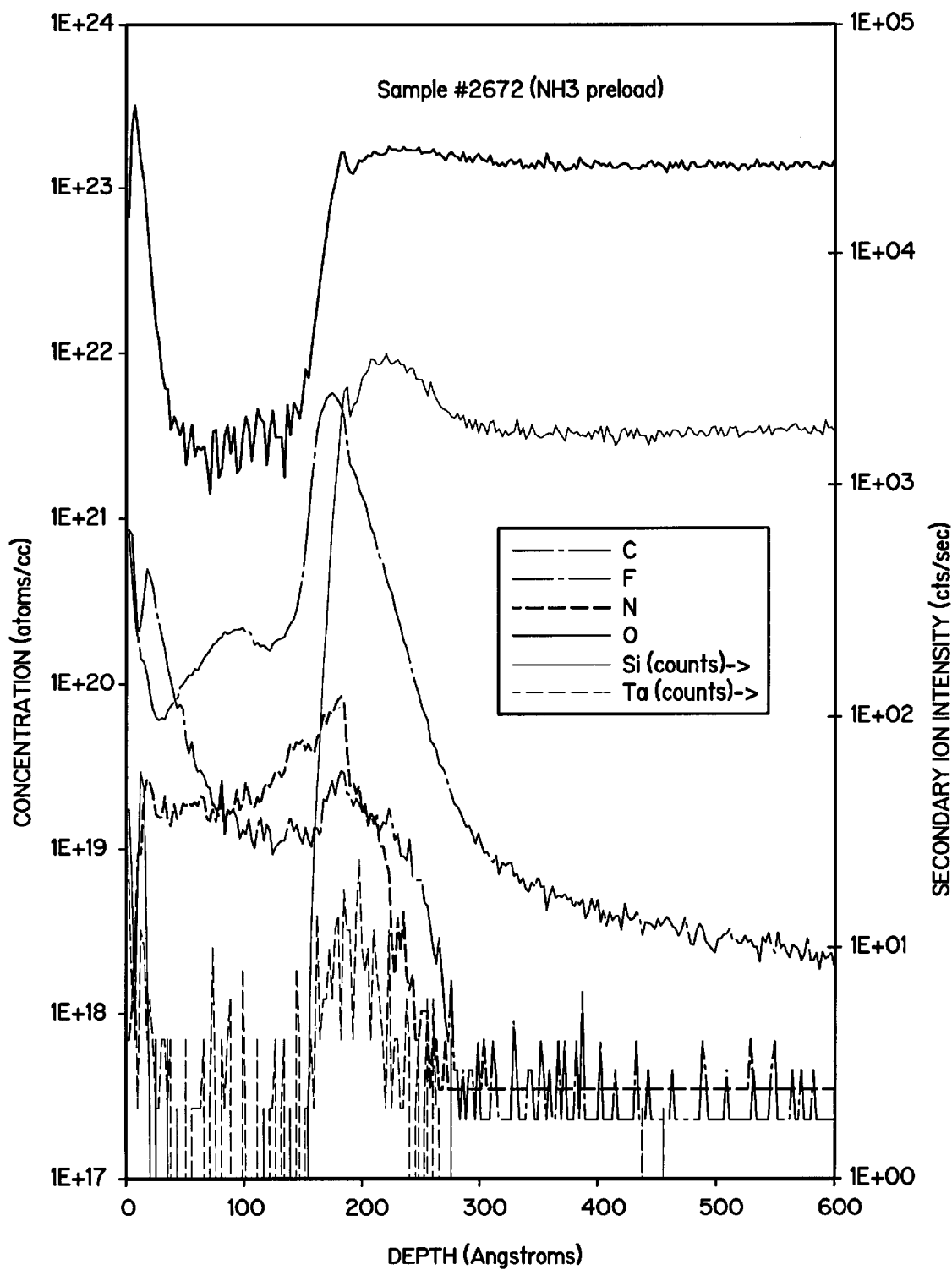
FIG. 2 is a SIMS depth profile of a tantalum layer deposited on silicon oxide following an ammonia treatment of the reactor surfaces prior to loading the silicon oxide wafer into the reactor chamber.

FIG. 2 shows a SIMS elemental depth profile for this 20 nm tantalum layer. Nitrogen is incorporated into the tantalum layer and is observed to have a peak concentration, due to the ammonia pre-load treatment, of about 0.1 atomic percent near the interface between the tantalum layer and the underlying oxide. Fluorine is also present in the tantalum layer at an average level of about 0.5 atomic percent. Near the tantalum/oxide interface, fluorine exhibits a peak concentration of about 5 atomic percent.

Test Example 1

According to one embodiment of the present invention including a nitrogenous gas thermal pretreatment, a silicon oxide-covered surface of a silicon substrate was loaded into a CVD reactor similar to reactor 20 and heated in a gaseous atmosphere of ammonia ($NH_3$) to a temperature of about 350° C. The ammonia flowed into the reactor at a rate of 2000 sccm such that the reactor pressure was maintained at about 2 Torr. After a predetermined exposure time of about 1 minute, the reactor was evacuated. A tantalum layer having a nominal thickness of 20 nm was then deposited by plasma-enhanced CVD using tantalum pentahalide as a vapor-phase reactant and hydrogen as a reducing gas. Deposition conditions for the tantalum layer included a substrate temperature of about 350° C.; a tantalum fluoride flow rate of about 20 sccm; a hydrogen flow rate of about 2000 sccm; an argon flow rate of about 300 sccm; a reactor vacuum pressure of about 2 Torr; and an RF power of about 250 Watts at a frequency of about 13.6 MHz.

Using a pull test, the tantalum layer deposited following the thermal pretreatment of the silicon oxide with the ammonia atmosphere was found to have a significantly improved adhesion compared to the tantalum film deposited after a pre-load ammonia treatment onto the surface of the substrate having no nitrogenous gas pretreatment. Therefore, the improvement in the adhesion correlates with the introduction of a concentration of nitrogen and hydrogen at the tantalum/oxide interface.

Test Example 2

According to another embodiment of the present invention including a nitrogen-containing plasma pretreatment, a silicon oxide-covered surface of a silicon substrate was loaded into a CVD reactor similar to reactor 20, heated to about 350° C., and exposed to a plasma generated from an ammonia ($NH_3$) process gas for about 1 minute. A tantalum layer having a nominal thickness of 20 nm was then deposited by plasma-enhanced CVD using tantalum pentahalide as a vapor-phase reactant and hydrogen as a reducing gas. Deposition conditions included a substrate temperature of about 350° C.; a tantalum fluoride flow rate of about 20 sccm; a hydrogen flow rate of about 2000 sccm; an argon flow rate of about 300 sccm; a reactor vacuum pressure of about 2 Torr; and an RF power of about 250 Watts at a frequency of 13.6 MHz.

Figure 3:
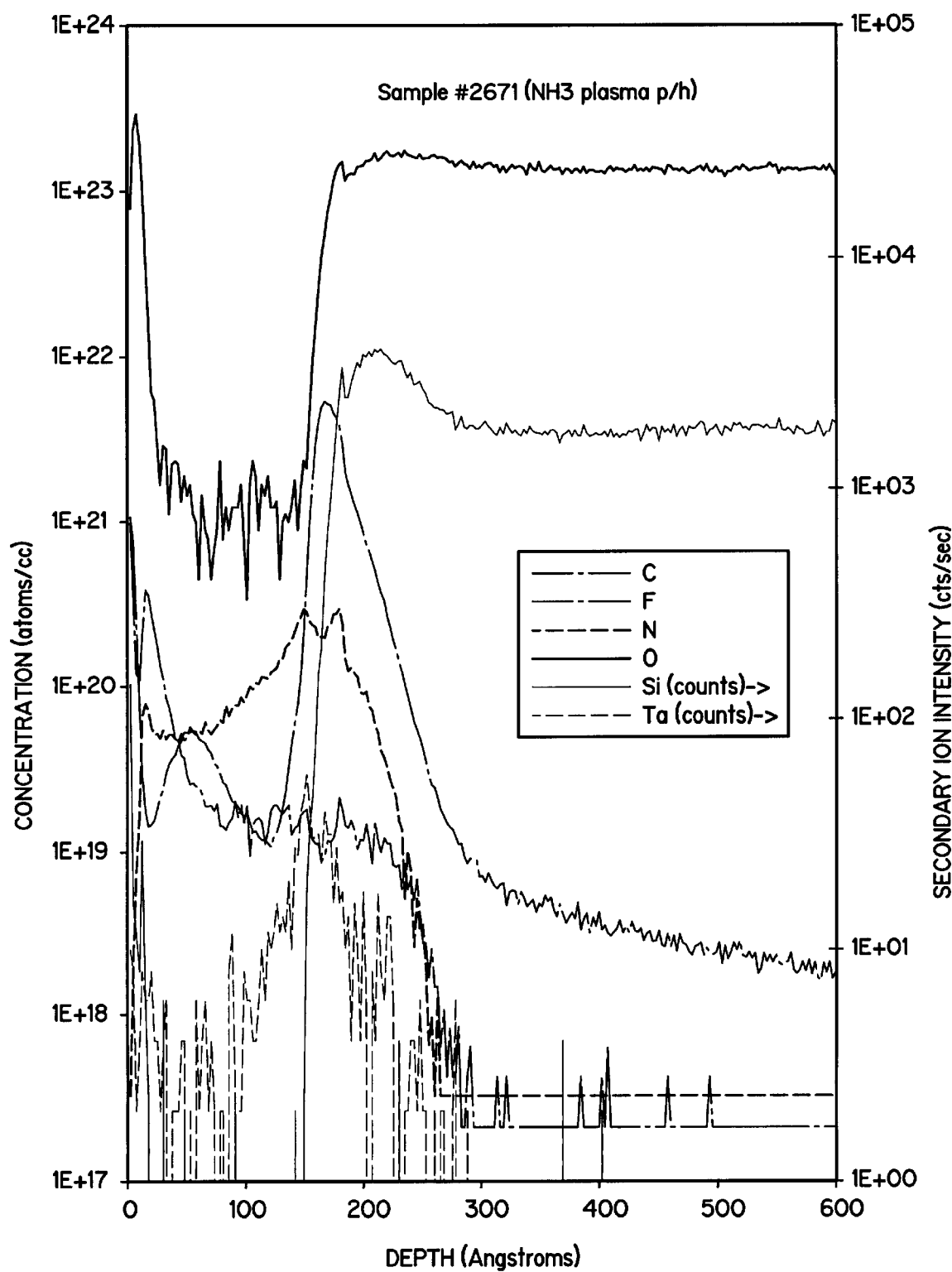
FIG. 3 is a SIMS depth profile of a tantalum layer deposited on silicon oxide following a nitrogen plasma pretreatment of the surface of the silicon oxide with an ammonia plasma according to principles of the present invention.

FIG. 3 shows a SIMS elemental depth profile for this 20 nm tantalum layer deposited after the ammonia plasma pretreatment. Nitrogen is present as an impurity in the layer of tantalum and, near the tantalum/oxide interface, the concentration of nitrogen peaks at about 0.4 atomic percent due to the pretreatment. This is a significant increase over the 0.1 atomic percent peak observed where only a pre-load treatment was conducted (FIG. 2). Fluorine is also present in the tantalum layer at an average level of about 0.5 atomic percent. Near the tantalum/oxide interface, fluorine exhibits a peak concentration of about 5 atomic percent. The results of pull testing indicate that the presence of nitrogen and hydrogen near the metal/oxide interface correlates with enhanced adhesion of the tantalum layer to the underlying oxide-covered substrate.

While the present invention has been illustrated by the description of embodiments thereof, and while these embodiments have been described in considerable detail, they are not intended to restrict or in any way limit the scope of the appended claims to such detail. Additional advantages and modifications will readily appear to those ordinarily skilled in the art. For example, a thermal or plasma pretreatment of a dielectric surface using a nitrogen-containing process gas may reduce the effect of by-product halogen atoms upon the adhesion of a superjacent layer of titanium nitride or titanium deposited by CVD using a titanium halide vapor-phase reactant. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of improving adhesion of a transition metal-based material to a dielectric-covered substrate, the method comprising:

positioning the substrate in a reaction chamber;

heating the substrate to a predetermined temperature;

providing a gas atmosphere comprising a nitrogen-containing and hydrogen-containing process gas and a first transition metal halide vapor-phase reactant adjacent a surface of the dielectric, the first transition metal halide vapor-phase reactant originating from residual transition metal halide transported to the surface of the dielectric from an internal chamber surface of the reaction chamber;

creating a plasma from the gas atmosphere;

exposing the heated substrate to the plasma for a predetermined time sufficient to form a layer of transition metal nitride on the surface of the dielectric; and thereafter depositing a layer of transition metal-based material by a CVD process onto a surface of the layer of transition metal nitride via a chemical reaction between a second transition metal halide vapor-phase reactant and a reducing gas, the layer of transition metal nitride and the layer of transition metal-based material defining an interface, wherein by-product halogen atoms are created at the interface by the chemical reaction and wherein the layer of transition metal nitride reduces the effect of the by-product halogen atoms resident at the interface upon adhesion of the transition metal-based material to the surface of the dielectric.

2. The method of claim 1, wherein the first and second transition metal halide vapor-phase reactants are tantalum halides.

3. The method of claim 2, wherein each of the tantalum halides is selected from the group consisting of tantalum pentafluorides, tantalum pentachlorides, tantalum pentabromides, and combinations thereof.

4. The method of claim 1 wherein the predetermined temperature is between about 150° C. and about 500° C.

5. The method of claim 4, wherein the predetermined temperature is about 350° C.

6. The method of claim 1, wherein the thickness of the layer of transition metal nitride is between about 0.5 nm and about 2.5 nm.

7. The method of claim 1, wherein the nitrogen-containing and hydrogen-containing process gas is selected from the group consisting of ammonia, hydrazine, a mixture hydrogen and nitrogen, and combinations thereof.

8. The method of claim 1, wherein the predetermined time is between about 15 seconds and about 10 minutes.

9. The method of claim 8, wherein the predetermined time is about 60 seconds.

10. A method of improving adhesion of a tantalum-based material to a dielectric-covered substrate, the method comprising:

positioning the substrate in a reaction chamber;

heating the substrate to a predetermined temperature;

providing a gas atmosphere comprising a nitrogen-containing and hydrogen-containing process gas and a first tantalum halide vapor-phase reactant adjacent a surface of the dielectric, the first tantalum halide vapor-phase reactant originating from residual tantalum halide transported to the surface of the dielectric from an internal chamber surface of the reaction chamber;

exposing the heated substrate to the plasma for a predetermined time sufficient to form a layer of tantalum nitride on the surface of the dielectric; and thereafter depositing a layer of tantalum-based material by a CVD process onto a surface of the layer of tantalum nitride via a chemical reaction between a second tantalum halide vapor-phase reactant and a reducing gas, the layer of tantalum nitride and the layer of tantalum-based material defining an interface, wherein by-product halogen atoms are created at the interface by the chemical reaction and wherein the layer of tantalum nitride reduces the effect of the by-product halogen atoms resident at the interface upon adhesion of the tantalum-based material to the surface of the dielectric.

11. The method of claim 10, wherein each of the tantalum halide vapor-phase reactants is selected from the group consisting of tantalum pentafluorides, tantalum pentachlorides, tantalum pentabromides, and combinations thereof.

12. The method of claim 10, wherein the predetermined temperature is between about 150° C. and about 500° C.

13. The method of claim 12, wherein the predetermined temperature is about 350° C.

14. The method of claim 10, wherein the thickness of the layer of tantalum nitride is between about 0.5 nm and about 2.5 nm.

15. The method of claim 10, wherein the nitrogen-containing and hydrogen-containing process gas is selected from the group consisting of ammonia, hydrazine, a mixture hydrogen and nitrogen, and combinations thereof.

16. The method of claims 10, wherein the predetermined time is between about 15 seconds and about 10 minutes.

17. The method of claim 16, wherein the predetermined time is about 60 seconds.

* * * * *